United States Patent [19]

Taya

[11] Patent Number: 4,703,180
[45] Date of Patent: Oct. 27, 1987

[54] MICROWAVE DISCHARGE TYPE ION SOURCE FOR ION INJECTION DEVICES

[75] Inventor: Shunroku Taya, Mito, Japan
[73] Assignee: Hitachi, Ltd., Tokyo, Japan
[21] Appl. No.: 792,285
[22] Filed: Oct. 28, 1985

[30] Foreign Application Priority Data

Oct. 30, 1984 [JP] Japan ................................ 59-226745

[51] Int. Cl.⁴ ............................................. H01J 27/00
[52] U.S. Cl. ................................ 250/425; 250/423 R; 250/492.2; 313/363.1
[58] Field of Search .................... 250/285, 288, 423 R, 250/425, 492.2; 315/39, 111.81; 313/363.1

[56] References Cited

U.S. PATENT DOCUMENTS

| | | | |
|---|---|---|---|
| 2,756,341 | 7/1956 | White | 250/423 |
| 3,434,894 | 3/1969 | Gale | 250/492.2 |
| 3,547,074 | 12/1970 | Hirschfeld | 250/492.2 |
| 4,151,420 | 4/1979 | Keller | 250/492.2 |

*Primary Examiner*—Bruce C. Anderson
*Attorney, Agent, or Firm*—Antonelli, Terry & Wands

[57] ABSTRACT

A microwave discharge type ion source incorporating a plurality of vaporizing furnaces for vaporizing and ionizing solid or liquid specimens and suited for use in an ion implantation apparatus. The plurality of vaporizing furnaces are charged with a number of same type specimens or different types of specimens for allowing ionization of a same or different specimens in a continuous manner without interruption for supplementation or exchange of the specimens, the furnaces being then vacuumized. A corresponding number of feeding passages are provided for introducing exchangeably and selectively the vapors produced in the furnaces to the ionization chamber. Exchange of the vapors introduced to the ionization chamber is realized by correspondingly changing over electric heaters provided in association with the vaporizing furnaces, respectively. The microwave discharge type ion source exhibits significantly improved operation efficiency as well as much extended continuous operation because time consumption involved in supplementation or exchange of specimens and accompanying vacuumization is significantly reduced.

3 Claims, 5 Drawing Figures

MICROWAVE DISCHARGE TYPE ION SOURCE FOR ION INJECTION DEVICES

BACKGROUND OF THE INVENTION

The present invention relates to an ion source equipped with an evaporation furnace for vaporizing or evaporating a solid or liquid specimen (raw material) for ionization. In particular, the invention concerns an ion source incorporating plurality of vaporizing furnaces and suited for use in an ion implantation apparatus employed in a semiconductor device manufacturing process.

When a filament is made use of as the ion source in the ion implantation apparatus of a large current capacity employed for bombarding a semiconductor substrate with ions of an impurity material by using an ion beam of a large current on the order of 10 mA, there arises a problem that the filament undergoes remarkable and rapid consumption. As an attempt to overcome this problem, ionization by thermal electrons emitted from a filament tends to be replaced by an ion source in which a plasma discharge produced under an electric field of a microwave frequency is utilized. This type ion source is referred to as the microwave discharge type ion source.

FIG. 1 of the accompanying drawings is a schematic sectional view showing a hitherto known microwave discharge type ion source. Referring to the figure, microwave 13 produced by a magnetron 8 is introduced to an accelerating electrode 10 by way of a choke flange 14 to reach an ionization chamber 2.

A magnetic field is applied to the ionization box or chamber 2 by means of an excitation coil 12, while gas of a specimen or raw material is supplied to the ionization chamber 2 through a gas supply pipe 9. As the result, a plasma is ignited within the ionization chamber 2.

An ion beam 7 is let out under the action of an extracting electrode 15 applied with an extracting voltage approximating to the ground potential. The ion beam thus extracted is used for ion implantation.

In this connection, it is known that materials or specimens which are solid (or liquid) at a room temperature (e.g. $Al^+$, $Ga^+$, $P^+$, $As^+$, $Sb^+$) is often used in dependence on the types of ions.

In the case of the hitherto known ion source apparatus shown in FIG. 1, the solid or liquid specimen 3 to be ionized is placed in a vaporizing furnace 1 and vaporized under heating by a heater 4, wherein the gas resulted from vaporization is introduced into the ionization chamber 2 through a second gas feeding pipe 11 for ionization of the gas.

FIG. 2 is a sectional view showing a main portion of a hitherto known filament heating type ion source. In the figure, equivalent or same parts as those shown in FIG. 1 are denoted by like reference numerals.

Referring to FIG. 2, a vaporizing furnace 1 having an inner space to be charged with a solid or liquid specimen 3 is heated by means of a heater coil 4 disposed around the outer periphery of the furnace 1. The heating temperature is monitored by means of a thermometer which may be constituted by a thermocouple or the like, to be controlled and maintained at a predetermined value.

The gas resulted from vaporization of the solid or liquid specimen 3 is introduced into an ionization chamber 2 through a gas feeding pipe 11. A filament 19 is disposed under tension within the ionization chamber 2. Upon heating of the filament 19 through electrical energization, thermal electrons 20 are emitted into the ionization chamber 2 and collide with the specimen vapor or gas particles, which are thus ionized.

Although not shown in FIG. 2 for simplification of the illustration, the ionization chamber is externally applied with a magnetic field to impart the thermal electrons 20 with rotational movement for increasing the probability of collision.

The ions thus produced are drawn out under the action of the extracting electrode (not shown) in the form of an ion beam.

As will now be understood, the hitherto known ion sources including the microwave discharge type ion source are of the structure in which only one vaporizing furnace is provided. Such structure involves various problems mentioned below.

Since raw materials or specimens for different types of ions (e.g. $As^+$ and $P^+$) can not be charged simultaneously, it is impossible to produce the ions of different types in a continuous manner.

As the consequence, when different types of ions are required to be produced, the vaporizing furnace and the ion source must be cooled down after production of ions of a certain type. Subsequently, another type of raw material has to be placed in the vaporizing furnace which is of course accompanied with destruction of vacuum. After the vacuum in the vaporizing chamber has been restored, the vaporizing furnace is again heated up to produce another type of ion beam. During this process, the apparatus has to be shut down for a long period which usually amounts to two hours or more, which in turn means degradation in the operation efficiency as well as working ratio of the ion source.

Further, when the solid or liquid raw material within the vaporizing furnace has been exhausted before implantation of ions in a desired amount is attained, the procedure mentioned above has to be taken to again charge the vaporizing furnace with the raw material, involving the problem of degraded operation efficiency and working ratio.

SUMMARY OF THE INVENTION

It is an object of the present invention to provide an ion source apparatus which is immune to the drawbacks of the prior art ion sources described above.

Antoher object of the invention is to provide an ion source apparatus which is equiped with a plurality of vaporizing furnaces.

In view of the above objects, the invention starts from the recognition that the ion source apparatus of either the filament type or the microwave discharge type has an inner space available for installing a plurality of vaporizing furnaces and proposes effective utilization of the available existing inner space for installing the plurality of vaporizing furnaces.

DESCRIPTION OF THE PREFERRED EMBODIMENTS

Figure 1:
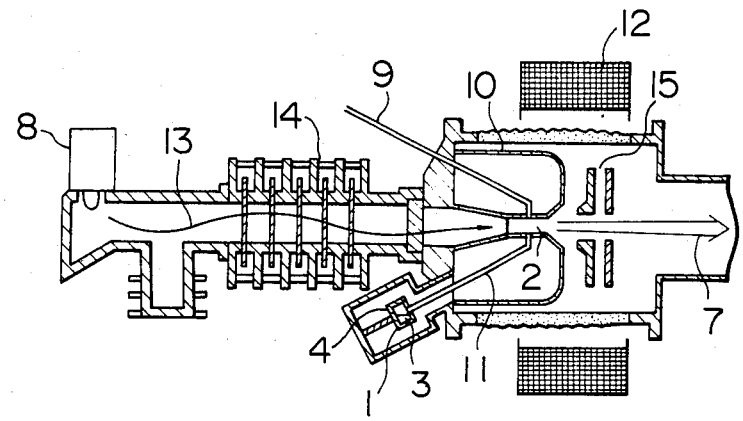
FIG. 1 is a sectional view showing a structure of a hitherto known microwave discharge type ion source.
Figure 2:
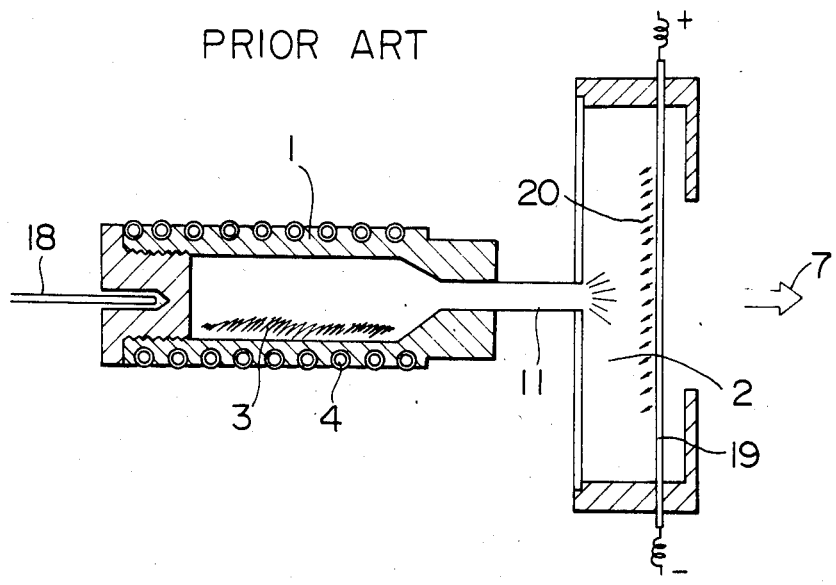
FIG. 2 is a schematic sectional view showing a structure of a hitherto known filament heating type ion source.
Figure 3:
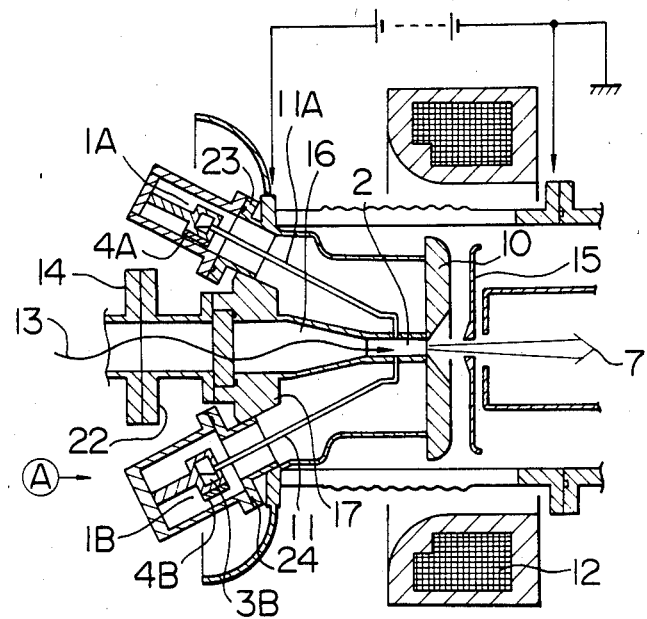
FIG. 3 is a sectional view showing a main portion of a microwave discharge type ion source according to a first embodiment of the invention.

FIG. 3 shows in a sectional view a main portion of a structure of the microwave plasma type ion source to which the present invention is applied. In the figure, like reference numerals as those used in FIG. 1 denote like or equivalent parts.

As will be seen in the figure, there is disposed at the center portion of the ion source a wave guide filled with an insulation material 16 for propagation of microwaves, wherein a plurality of vaporizing furnaces 1A, 1B and others are disposed around the outer periphery of the waveguide according to the teaching of the invention. All of these vaporizing furnaces may be of a same structure.

Figure 4:
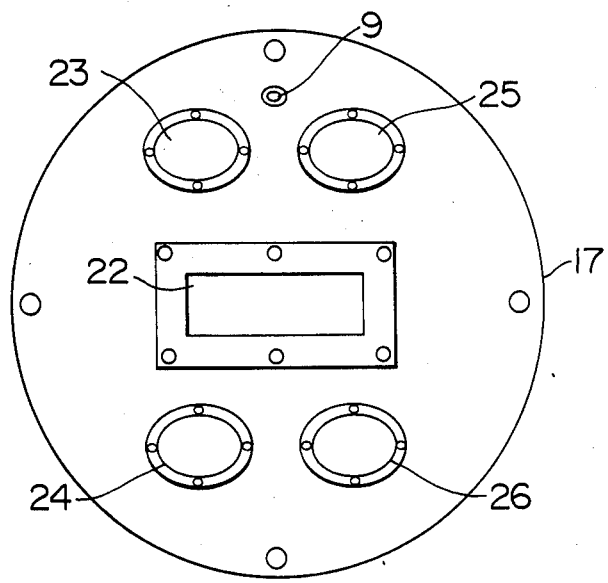
FIG. 4 is a plan view of a flange portion of the apparatus shown in FIG. 3.

FIG. 4 shows in a plan view a flange portion 17 of the ion source shown in FIG. 3. More specifically, the flange portion 17 is shown in a plan view as viewed from the left in FIG. 3. In FIG. 4, a reference numeral 17 denotes the flange portion of the ion source, 22 denotes an aperture for the microwave guide, and 23, 24, 25 and 26 denote mounting openings formed around the wave quide aperture for mounting thereon a corresponding number (four in the case of the illustrated embodiment) of the solid or liquid material vaporizing furnaces 1A, 1B and others.

In the ion implanting aparatus usually employed in the fabrication of semiconductor devices, arsenic and phosphor are often used in the solid phase from the viewpoint of safety, because gaseous materials $AsH_3$ and $PH_3$ are poisonous.

In such a case, the ion source including a plurality of the vaporizing furnaces according to the invention is advantageous in that the openings 23 and 25 may be used for mounting the furnaces for vaporizing phosphor while the openings 24 and 26 are destined for mounting the furnaces for vaporizing arsenic, by way of example. When one of the furnaces (e.g. 23 or 24) becomes empty, then other furnace (e.g. 25 or 26) may be heated up for vaporizing the allocated dopant material, thus making possible the implantation of same type ions in a continuous manner.

Further, when aresenic ion implantation is desired in succession to phosphor ion implantation, by way of example, implantation of both types of ions can be effected in a continuous manner by charging both types of raw materials in the vaporizing furnaces, respectively, whereby operation efficiency as well as the working ratio can be significantly enhanced.

Figure 5:
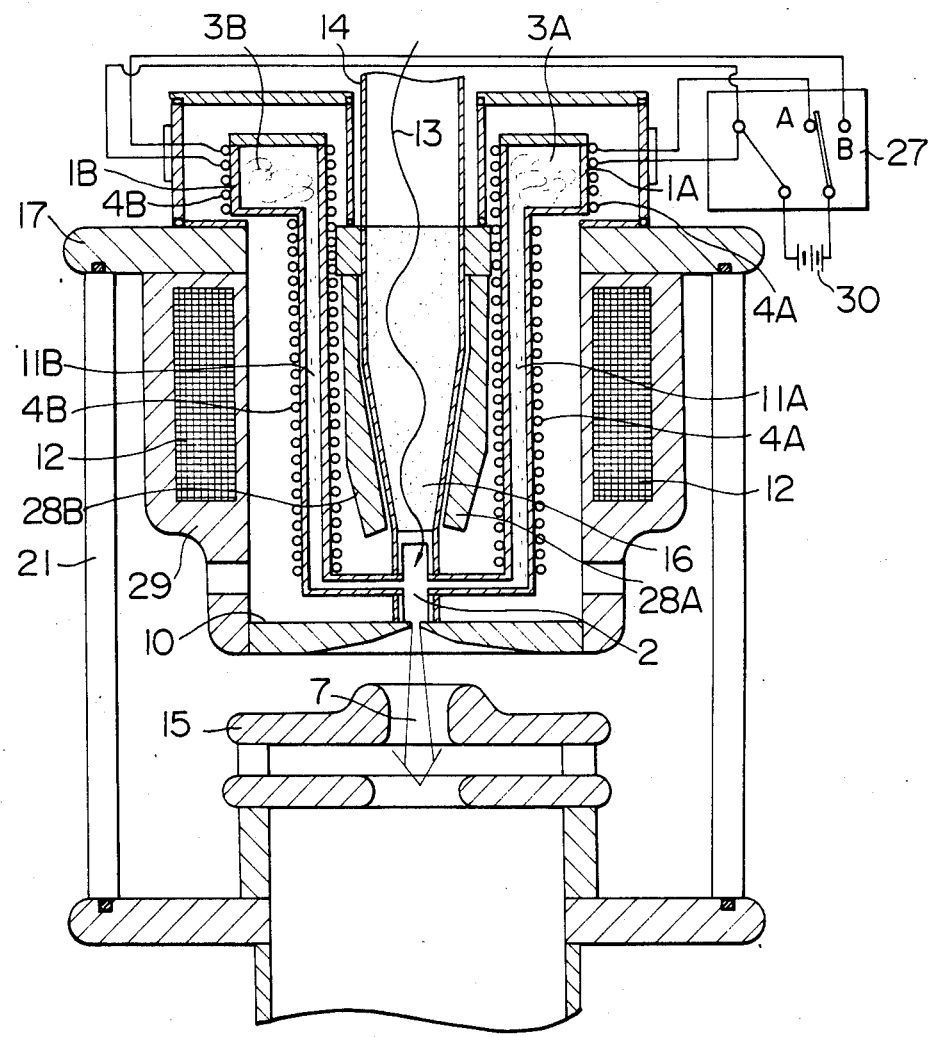
FIG. 5 is a view showing another embodiment of the invention.

FIG. 5 shows another embodiment of the invention in detail. The illustrated microwave discharge type ion source which may be referred to as the internal magnetic path type ion source is equipped with a pair of vaporizing furnaces. In this figure, equivalent or same parts as those shown in FIG. 3 are denoted by same reference numerals. The ion source shown in FIG. 5 is characterized in that the excitation coil 12 is mounted around the ionization chamber 2 to which an accelerating voltage is applied. The flange 17, accelerating electrode 10, coil bobbin 29 and magnetic pole shoes 28A and 28B are made of a magnetic material and serve to apply a magnetic field to the ionization chamber 2. By mounting the excitation coil in the vicinity of the ionization chamber in this manner, no discharge can take place between the flange 17 applied with the accelerating voltage and the excitation coil, whereby the whole structure of ion source can be implemented in a compact size.

Heater 4A and 4B are wound around the vaporizing furnaces 1A, 1B and the feeding passages 11A, 11B for heating them.

Connection of the heaters of the vaporizing furnaces to a power supply source 30 can be changed over through a change-over switch 27 having contacts A and B.

The spaces in which the raw materials or specimens 3A and 3B are placed are communicated with each other, as will be seen in FIG. 5. By virtue of this arrangement, vacuumization can be accomplished by using a single vacuum pump. Vaporization of raw materials charged previously in the respective furnace can be selectively realized merely by changing over the associated heaters without any need for additional vacuumization which has been heretofore required upon exchange of raw materials. Thus, operation efficiency can be enhanced.

As will be appreciated from the foregoing description, the microwave discharge type ion source according to the invention is substantially immune to the problems which the hitherto known ion source suffers. Through combination of the microwave ion source with a plurality of vaporizing chambers, operation time of the ion implantation apparatus can be significantly extended, which means that operation efficiency in the fabrication of semiconductor devices as well as the working ratio of the ion implantation apparatus is remarkably improved.

I claim:

1. An ion source for ion injection devices, comprising:
    a plurality of vaporizing furnaces each for vaporizing a solid or liquid specimen disposed therein by heating through a heater respectively associated with each of said plurality of vaporizing furnaces;
    a plurality of ion introducing means each for introducing vapor produced in the associated furnaces to an ionization chamber;
    means for ionizing the vapor introduced in said ionizing chamber;
    means for extracting ions from said ionization chamber in the form of an ion beam;
    and means for selectively energizing the heater associated with a selected one of said plurality of vaporizing furnaces so as to exchange vapors introduced into said ionization chamber.

2. An ion source for ion injection devices according to claim 1, wherein said plurality of vaporizing furnaces are disposed around the axis of said ion source.

3. An ion source for ion injection devices according to claim 1, wherein said plurality of vaporizing furnaces are disposed around the axis of said ion source substantially symmetrically to one another.

* * * * *